(12) United States Patent
Dong et al.

(10) Patent No.: US 12,474,276 B2
(45) Date of Patent: Nov. 18, 2025

(54) WAFER INSPECTION SYSTEM FOR MITIGATING UNDESIRED EFFECTS ASSOCIATED WITH POSITION OFFSET OF WAFER

(71) Applicant: BRIGHTEST TECHNOLOGY TAIWAN CO., LTD., Hsinchu County (TW)

(72) Inventors: Zhong-Hua Dong, Sunnyvale, CA (US); Chengwei Hsu, Hsinchu County (TW)

(73) Assignee: BRIGHTEST TECHNOLOGY TAIWAN CO., LTD., Hsinchu County (TW)

( * ) Notice: Subject to any disclaimer, the term of this patent is extended or adjusted under 35 U.S.C. 154(b) by 54 days.

(21) Appl. No.: 18/399,750

(22) Filed: Dec. 29, 2023

(65) Prior Publication Data

US 2025/0216339 A1 Jul. 3, 2025

(51) Int. Cl.
| | |
|---|---|
| *G01N 21/95* | (2006.01) |
| *H04N 23/56* | (2023.01) |
| *H04N 23/60* | (2023.01) |
| *H04N 23/74* | (2023.01) |

(52) U.S. Cl.
CPC ......... *G01N 21/9501* (2013.01); *H04N 23/56* (2023.01); *H04N 23/60* (2023.01); *H04N 23/74* (2023.01); *G01N 2201/06113* (2013.01)

(58) Field of Classification Search
CPC ..... G01N 21/9501; G01N 2201/06113; H04N 23/56; H04N 23/60; H04N 23/74
See application file for complete search history.

(56) References Cited

U.S. PATENT DOCUMENTS

| | | | |
|---|---|---|---|
| 5,784,166 A | * 7/1998 | Sogard | G03F 7/70358 250/559.3 |
| 6,363,168 B1 | * 3/2002 | Kakuma | G06T 7/74 348/87 |
| 9,406,480 B2 | 8/2016 | Noji et al. | |
| 10,539,511 B2 | 1/2020 | Nishizawa et al. | |

(Continued)

FOREIGN PATENT DOCUMENTS

TW 202349141 A 12/2023

OTHER PUBLICATIONS

English abstract of TW 202349141A.

*Primary Examiner* — Richard A Hansell, Jr.
(74) *Attorney, Agent, or Firm* — WPAT, P.C.; Anthony King (57) ABSTRACT

A wafer inspection system includes an optical device, a movable stage, a position measurement device, and a control device. The optical device is configured to generate a light toward a wafer and capture a reflected light. The movable stage is configured to move the wafer. The position measurement device is configured to obtain a position offset between an actual path and a predetermined path. The position offset includes a first error and a second error. A stage coordinate system has a first and a second stage axis perpendicular to each other, and the first and the second errors are parallel to the first and the second stage axis, respectively. The control device is configured to control a timing for emitting the light or control a timing to capture the reflected light according to the position offset in real time in order to mitigate undesired effects caused by the position offset.

20 Claims, 9 Drawing Sheets

(56) References Cited

U.S. PATENT DOCUMENTS

| | | | |
|---|---|---|---|
| 2006/0028630 A1* | 2/2006 | Akimoto | G03F 7/70341 |
| | | | 355/53 |
| 2008/0094604 A1* | 4/2008 | Shibazaki | G03F 7/70758 |
| | | | 355/72 |
| 2010/0134778 A1* | 6/2010 | Schoormans | G03F 7/70725 |
| | | | 355/72 |
| 2017/0350696 A1* | 12/2017 | Du | G03F 9/7088 |
| 2019/0252151 A1* | 8/2019 | Kato | H01J 37/20 |
| 2020/0006102 A1* | 1/2020 | Lin | G03F 7/70633 |
| 2020/0126830 A1* | 4/2020 | Dowling | H01L 21/67288 |
| 2021/0096061 A1* | 4/2021 | Hill | G01B 11/25 |
| 2024/0219297 A1* | 7/2024 | Jung | G01N 21/31 |
| 2024/0367267 A1* | 11/2024 | Leichsenring | B23K 26/066 |

* cited by examiner

WAFER INSPECTION SYSTEM FOR MITIGATING UNDESIRED EFFECTS ASSOCIATED WITH POSITION OFFSET OF WAFER

TECHNICAL FIELD

The present application relates to a wafer inspection system, particularly to a wafer inspection system having an ability to reduce vibration.

BACKGROUND

In modern semiconductor processing, an inspection procedure includes capturing a wafer's image for inspection. However, stage vibration causes image distortion, which reduces quality of the inspection. For example, a qualified wafer may be rejected due to a noisy image. Therefore, an effective means of reducing noise in the wafer's captured image is critical to improving the quality of the wafer inspection.

SUMMARY OF THE INVENTION

One aspect of the present disclosure provides a wafer inspection system. The wafer inspection system includes an optical device, a movable stage, a position measurement device, and a control device. The optical device includes a light source and an image sensor. The light source is configured to generate an incident light and direct the incident light through an illumination optical toward a wafer, so as to generate a reflected light accordingly. The image sensor is configured to capture the reflected light through an imaging optical and generate an image of the wafer accordingly. The movable stage is configured to bear the wafer and move the wafer according to a predetermined moving path. The position measurement device is configured to obtain a position offset between an actual moving path of the movable stage and the predetermined moving path. The position offset includes a first dynamic position error and a second dynamic position error in a stage coordinate system. The first dynamic position error and the second dynamic position error both vary with time, the stage coordinate system has a first stage axis and a second stage axis perpendicular to each other, and the first dynamic position error and the second dynamic position error are parallel to the first stage axis and the second stage axis, respectively. The control device is configured to control a timing for the light source to emit the incident light or control the image sensor to capture the reflected light according to the first dynamic position error and the second dynamic position error in real time in order to mitigate undesired effects caused by the position offset.

Compared to conventional technology, the noise in the image of wafer can be reduced by controlling lighting source and/or camera's timing for capturing the image. Therefore, the quality of the wafer inspection can be improved.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the normal deviation found in the respective testing measurements. Also, as used herein, the terms "substantially," "approximately," or "about" generally mean within a value or range which can be contemplated by people having ordinary skill in the art. Alternatively, the terms "substantially," "approximately," or "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages, such as those for quantities of materials, durations of times, temperatures, operating conditions, ratios of amounts, and the likes thereof disclosed herein, should be understood as modified in all instances by the terms "substantially," "approximately," or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Figure 1:
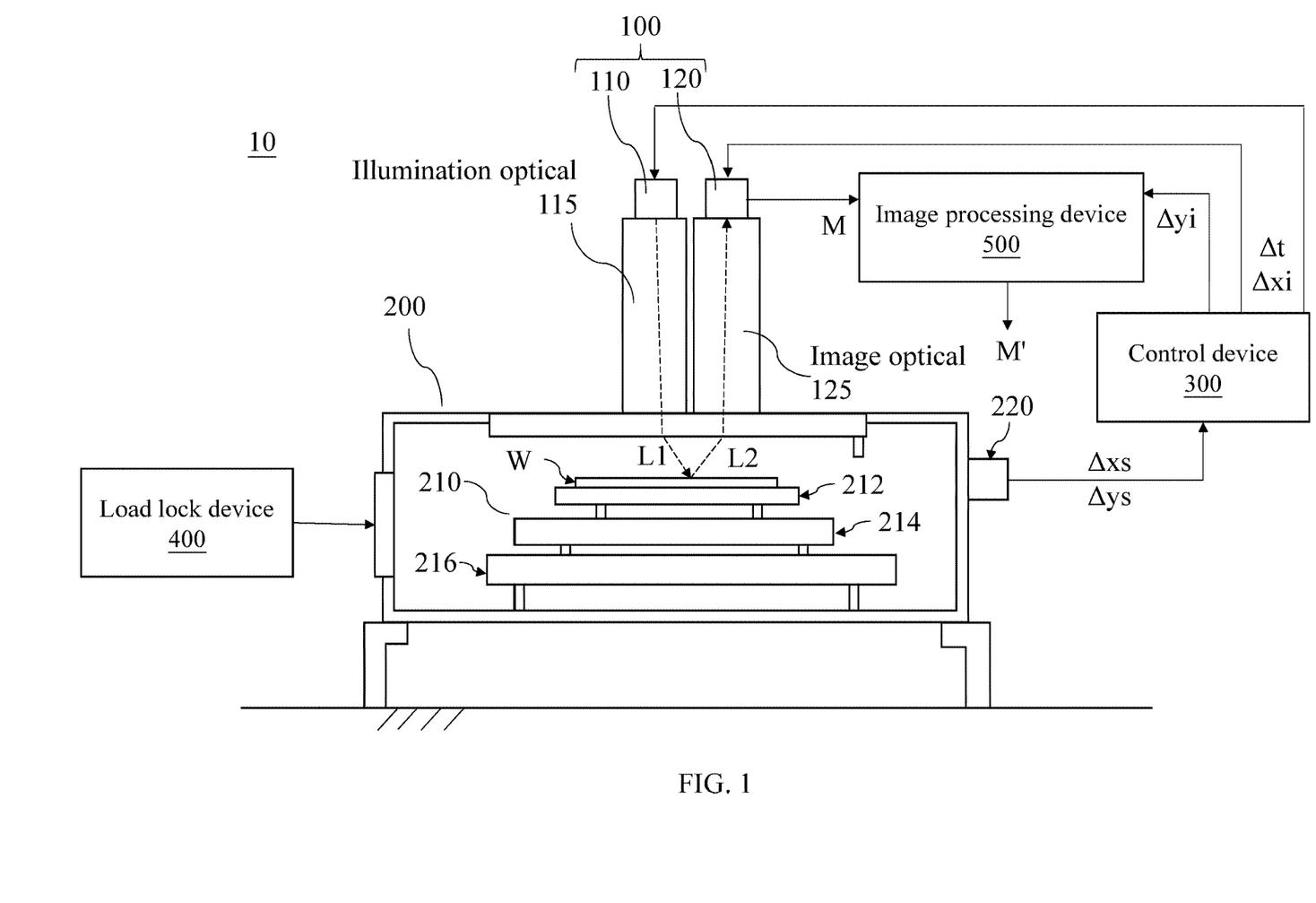
FIG. 1 is a schematic diagram of a wafer inspection system according to some embodiments of the present disclosure.

FIG. 1 is a schematic diagram of a wafer inspection system 10 according to some embodiments of the present disclosure. The wafer inspection system 10 is utilized to inspect a wafer W for determining whether the wafer W satisfies a requirement.

The wafer inspection system 10 includes an optical device 100, a chamber 200, a control device 300, a load lock device 400, and an image processing device 500. The optical device 100 is mounted on the chamber 200.

The optical device 100 includes a light source 110, an illumination optical 115, an image sensor 120, and an image optical 215. The light source 110 is configured to generate an incident light L1 through the illumination optical 115 toward the wafer W, so as to generate a reflected light L2 accordingly. The illumination optical 115 is configured to direct the incident light L1 and control a light beam of the incident light L1. The image sensor 120 is configured to capture the reflected light L2 through the image optical 215 and generate an image M of the wafer W for inspection accordingly. The image optical 215 is configured to direct the reflected light L2 and control a light beam of the reflected light L2. In some embodiments, there is some distortion may exist in the image M, and the image process device 500 receives the image M and may calibrate the image M to generate an updated image M' for displaying.

In some embodiments, the incident light L1 is a continuous wave (CW) light source, and the image sensor 120 may use a shutter to control a timing of periodically capturing the reflected light L2. In some embodiments, the incident light L1 is a continuous wave (CW) laser. In some embodiments, the incident light L1 is a pulsed laser, and the image sensor 120 may capture the reflected light L2 in a manner synchronous to the pulsed laser. In some embodiments, when the incident light L1 is the pulsed laser, the light source 110 may adjust a pulse period of at least one of laser pulse so as to control the timing that the image sensor 120 receiving the reflected light L2. In other embodiments, the light source 110 may mask at least one of leaser pulse.

The chamber 200 includes a movable stage 210 and a position measurement device 220. The movable stage 210 has an electrostatic chuck 212 configured to bear the wafer W. Furthermore, the movable stage 210 has a z stage 214 and an x-y stage 216. During the operations, the movable stage 210 moves the wafer W along a predetermined moving path P. The movable stage 210 moves the wafer W at a speed ranging from zero to a predetermined target moving speed.

In some embodiments, after the movable stage 210 reaches the target moving speed, the movable stage 210 maintains the target moving speed. In other words, except at an initial stage, the movable stage 210 always moves at a constant speed. In some embodiments, the chamber 200 is a vacuum chamber.

Figure 2:
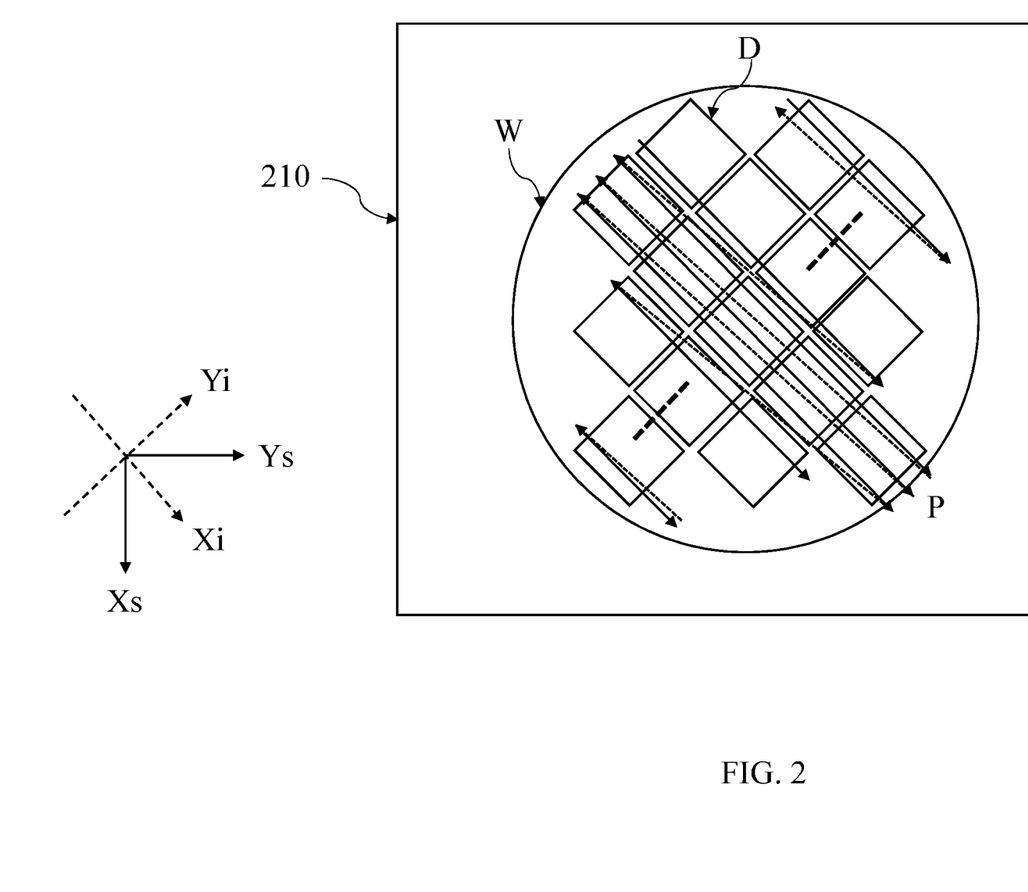
FIG. 2 is a schematic diagram of a wafer with a predetermined moving path on a movable stage according to some embodiments of the present disclosure.
Figure 3:
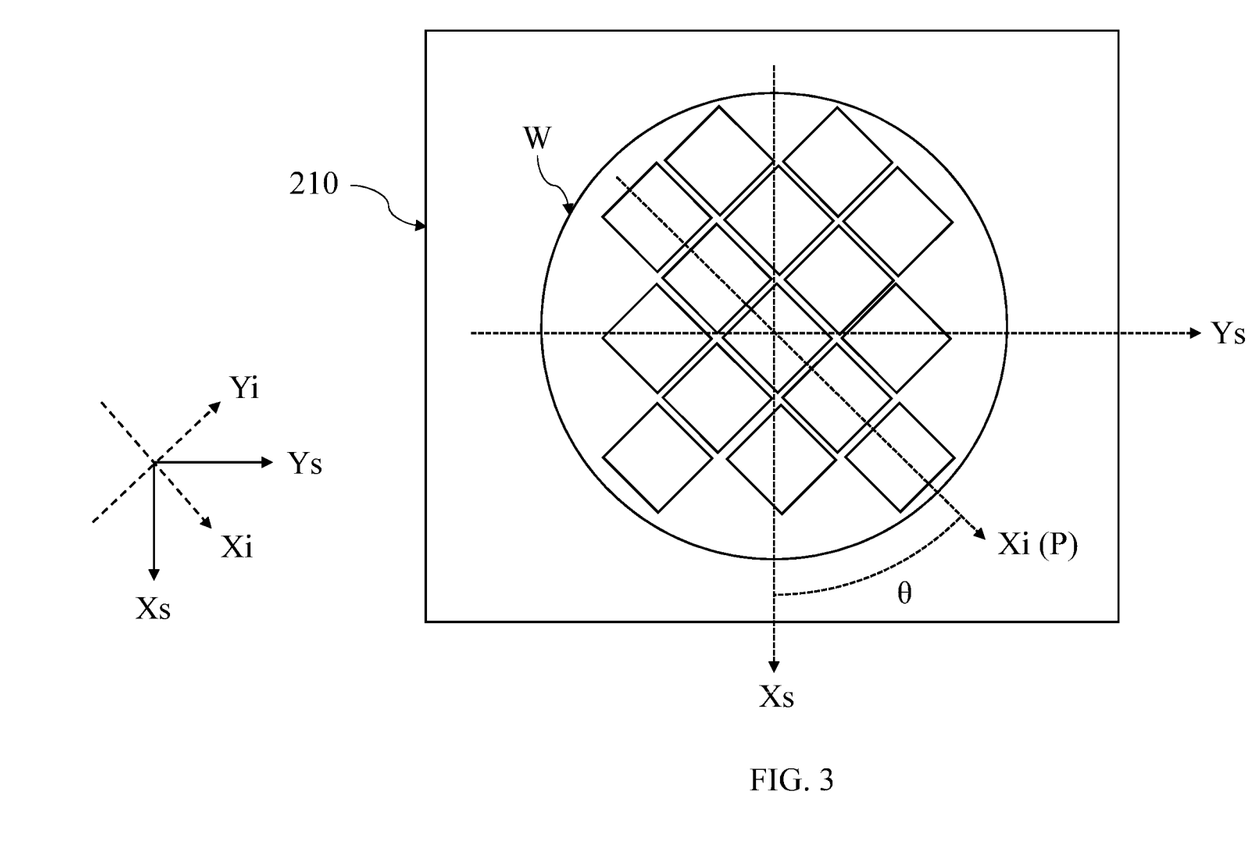
FIG. 3 is a schematic diagram of a wafer with a predetermined moving path with respect to a stage coordinate system and an image coordinate system according to some embodiments of the present disclosure.

Reference is made to FIG. 2 and FIG. 3. FIG. 2 is a schematic diagram showing the wafer W held by the movable stage 210 on the predetermined moving path P according to some embodiments of the present disclosure. FIG. 3 is a schematic diagram showing the predetermined moving path P with respect to a stage coordinate system and an image coordinate system according to some embodiments of the present disclosure.

As illustrate in FIG. 2, there are dies D disposed on the wafer W along columns. The predetermined moving path P is bouncing along a primary dimension of the columns.

The movable stage 210 uses a stage coordination system having a first stage axis Xs and a second stage axis Ys perpendicular to each other. The image M is defined by an image coordination system having a first image axis Xi and a second image axis Yi perpendicular to each other. In some embodiments, the predetermined moving path P is controlled to be parallel to the first image axis Xi as illustrated in FIG. 3. An included angle θ between the first stage axis Xs and the first image axis Xi is greater than 0 and less than 90 degrees. In some embodiments, the included angle θ is substantially equal to 45 degrees.

In the real word, mechanical devices can have various kinds of vibration during operation. The vibration may be caused by a running of a motor, particles on a track, or any other suboptimal conditions. Similarly, the instant wafer inspection system 10 also incurs vibrations that introduce noise to an inspection result, i.e., reduction of a clarity of the image M. The disturbance or vibration of the movable stage 210 has a component with respect to the predetermined moving path P. For example, when the predetermined moving path P is a straight line along first image axis Xi, the movable stage 210 should move along the first image axis Xi. However, when the disturbance exists, an actual moving path of the movable stage 210 may not be exactly identical to the designated moving path P. Therefore, deviations between the actual moving path P' (shown in FIG. 5) and the predetermined moving path P represent the effect of the disturbance, which can be described using the illustrations shown in FIG. 4 and FIG. 5.

Figure 4:
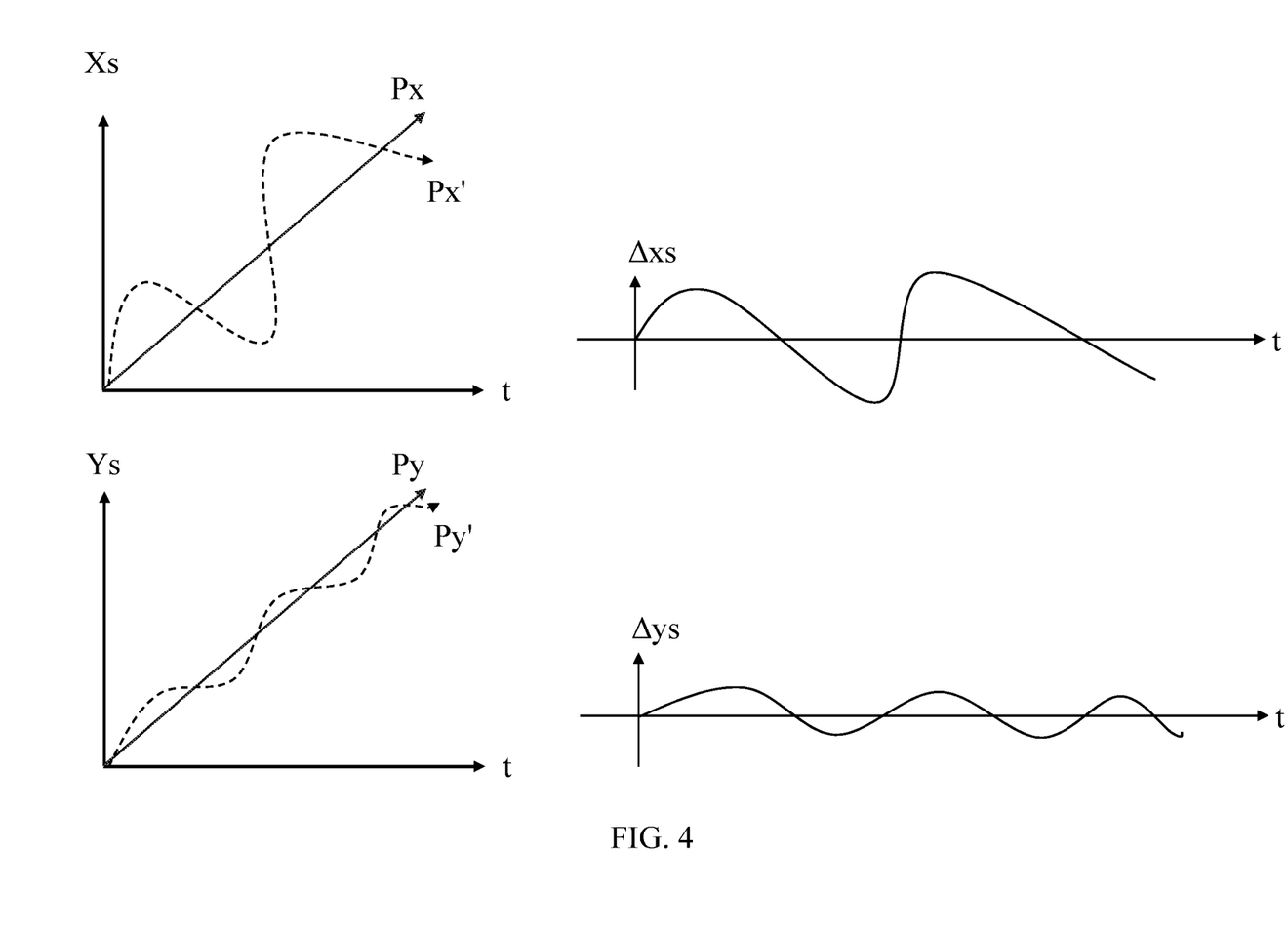
FIG. 4 is a schematic diagram of a position offset between an actual moving path and a predetermined moving path according to some embodiments of the present disclosure.
Figure 5:
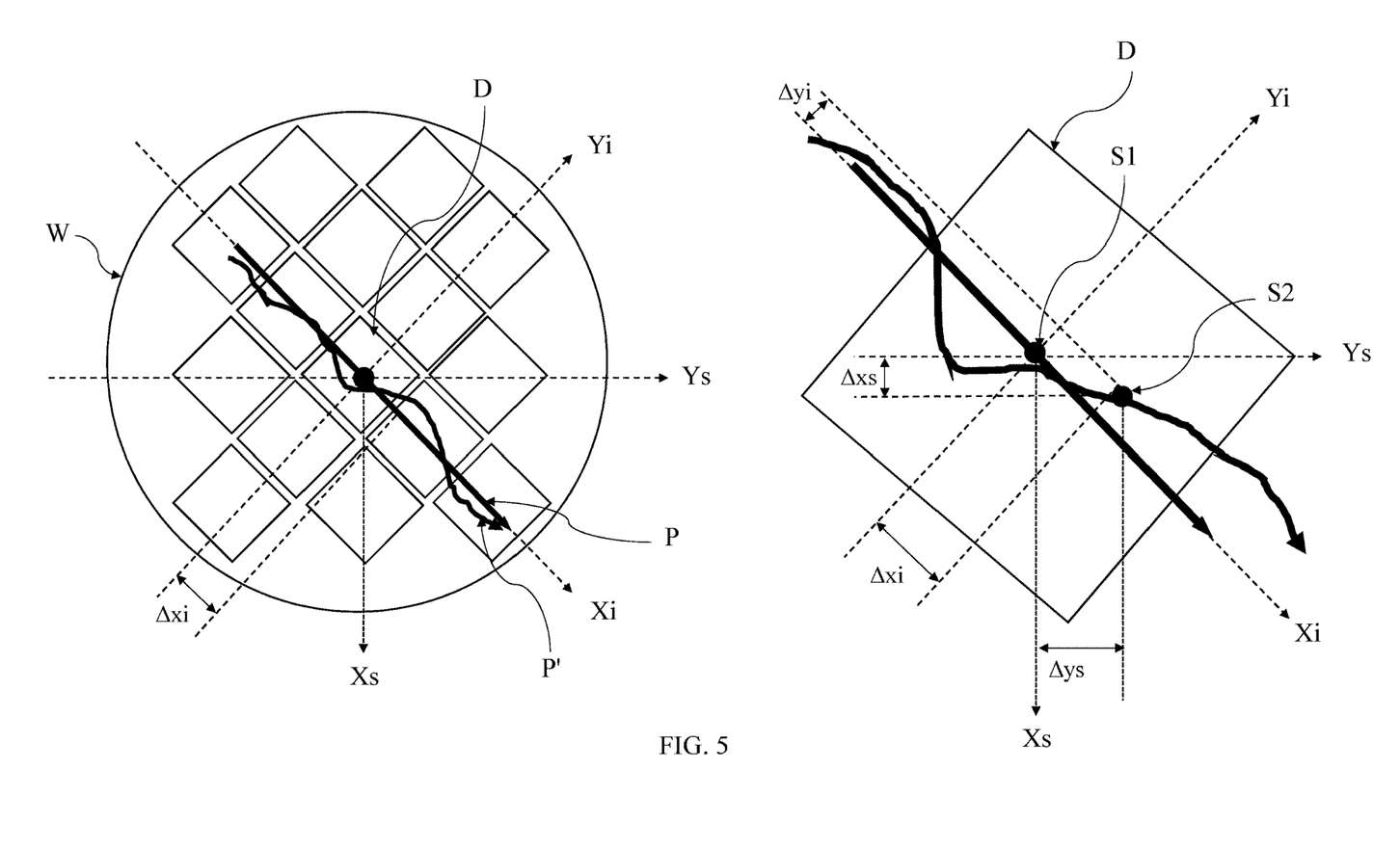
FIG. 5 is a schematic diagram illustrating a position offset on a wafer according to some embodiments of the present disclosure.

Reference is made to FIG. 4 and FIG. 5. FIG. 4 is a schematic diagram of a position offset between the actual moving path P' and the predetermined moving path P according to some embodiments of the present disclosure, and FIG. 5 is a diagram of the position offset on a wafer W according to some embodiments of the present disclosure.

The disturbance can be represented by the position offset, and the position offset is composed of a first dynamic position error $\Delta xs$ along the first stage axis Xs and a second dynamic position error $\Delta ys$ along the second stage axis Ys. In FIG. 4, Px and Py respectively represent the predetermined moving path along the first stage axis Xs and the second stage axis Ys, and Px' and Py' respectively represent the actual moving path along the first stage axis Xs and the second stage axis Ys. The first dynamic error $\Delta xs$ is equal to Px' minus Px, and the second dynamic position error $\Delta ys$ is equal to Py' minus Py. It should be noted that the movable stage 210 is keeping moving during the operations, therefore, the first dynamic error $\Delta xs$ and the second dynamic position error $\Delta ys$ both vary with time.

The position measurement device 220 is configured to obtain the position offset, i.e., the first dynamic position error Δxs and the second dynamic position error Δys. In other embodiments, the position measurement device 220 may obtain only the first dynamic position error Δxs or only the second dynamic position error Δys depending on a need of the wafer inspection.

In some embodiments, the position measurement device 220 is a laser interferometer. However, the present disclosure is not limited thereto. Any suitable measurement device is within the completed scope of the present disclosure.

The control device 300 is configured to receive the first dynamic position error Δxs and the second dynamic position error Δys, and to instruct the image sensor 120 to generate the image M accordingly. More specifically, the control device 300 is configured to control the timing that the image sensor 120 generates the image M to mitigate the effect of the disturbance caused by the movable stage 210 according to the first dynamic position error Δxs and the second dynamic position error Δys, so as to optimize a quality of the image M.

In some embodiments, the control device 300 further converts the first dynamic position error Δxs and the second dynamic position error Δys into a horizontal displacement Δxi and a vertical displacement Δyi of the image coordination system which is employed by the optical device 100. Reference is made to right side of FIG. 5. Right side of FIG. 5 illustrates an enlarged portion of the wafer W of the left side of FIG. 5, more specifically, the right side of FIG. 5 illustrates a die D of the wafer W. To facilitate understanding, a segment of the predetermined moving path P and a segment of the actual moving path P' are illustrated crossing the die D, and a position S1 and a position S2 are illustrated on the segments of the predetermined moving path P and the actual moving path P', respectively. The image sensor 120 is able to capture an image of a region on the wafer W, which the region is projected by the field of view of the image sensor 120. When the wafer W moves along the predetermined moving path P or the actual moving path P' in the direction of the arrow, the field of view of the image sensor 120 will substantially move along the predetermined moving path P or the actual moving path P' in the opposite direction of the arrow. The position S1 on the predetermined moving path P represents the position sensed by the image sensor 120 at a specific time node in the ideal case; and the position S2 on the actual moving path P' is an actual position sensed by the image sensor 120 at the specific time node. A distance between the position S2 and the position S1 along the first stage axis Xs is the first dynamic position error Δxs, and a distance between the position S2 and the position S1 along the second stage axis Ys is the second dynamic position error Δys Similarly, a distance between the position S2 and the position S1 along the first image axis Xi is the horizontal displacement Δxi, and a distance between the position S2 and the position S1 along the second image axis Ys is the vertical displacement Δyi. The horizontal displacement Δxi and the vertical displacement Δyi are parallel to the first image axis Xi and the second image axis Yi, respectively. The control device 300 instructs the optical device 100 using the horizontal displacement Δxi and the vertical displacement Δyi.

In some embodiments, a Fourier analysis of the disturbance shows a main portion of the disturbance ranging in frequency from about 10 Hz to 1 KHz. In conventional arts, a low-frequency disturbance, such as a disturbance with frequency lower than 60 Hz, can be eliminated by generating a position offset for the optical device to track the disturbance. In this way, the system needs an additional mechanism to move the optical device so as to synchronize the positions of the optical device and the wafer. However, the optical device is not always able to move quickly enough when the frequency exceeds an ability of the mechanism. In contrast to the conventional art, the present disclosure provides the wafer inspection system 10 to decrease the undesired effects caused by the disturbances of higher frequencies. In some embodiments, the wafer inspection system 10 is configured to decrease the undesired effects caused by the disturbances ranging in frequency from 60 Hz to 300 Hz.

In some embodiments, the predetermined moving path P is determined according to a layout on the wafer W, such as the arrangement of the dies D. Usually, the layout on the wafer W is associated with a crystal orientation of the wafer W. In other words, the predetermined moving path P has to be determined according to the crystal orientation of the wafer W.

The load lock device 400 is configured to control the orientation of the wafer W and transfer the wafer W into the chamber 200. After the chamber 200 receives the wafer W, the orientation of the wafer W remains unchanged during the operations, namely the wafer W do not rotate during the operations. Thus, the load lock device 400 has to rotate the wafer W to a desired orientation according to the predetermined moving path P before transferring the wafer W into the chamber 200.

In some embodiments, a direction of a primary component of the disturbance is related to an installation of the movable stage 210, and can be obtained offline. The direction of the primary component can be determined based on a statistical calculation of previous operations, i.e., offline data. In some embodiments, the wafer inspection system 10 exhibits a better performance of mitigating the effect of the disturbance when the position offset is parallel to the predetermined moving path P. Therefore, by appropriately deciding the orientation of the wafer inspection system 10, the direction of the primary component is controlled to be parallel to the predetermined moving path P, i.e., the first image axis Xi is parallel to the primary component. Because the direction of the predetermined moving path P is associated with the orientation of the wafer W, the load lock device 400 is configured to rotate the wafer W to have the predetermined moving path P be parallel to the first image axis Xi before transferring the wafer W into the chamber 200. However, the present disclosure is not limited thereto. In various embodiments, an included angle between the predetermined moving path P and the first image axis Xi is controlled to be greater than 0.

As mentioned above, the direction of the primary of disturbance is parallel to the first image axis, therefore, the horizontal displacement Δxi parallel to the first image axis Xi is greater than the vertical displacement Δyi parallel to the second image axis Yi and perpendicular to the first image axis Xi.

Figure 6:
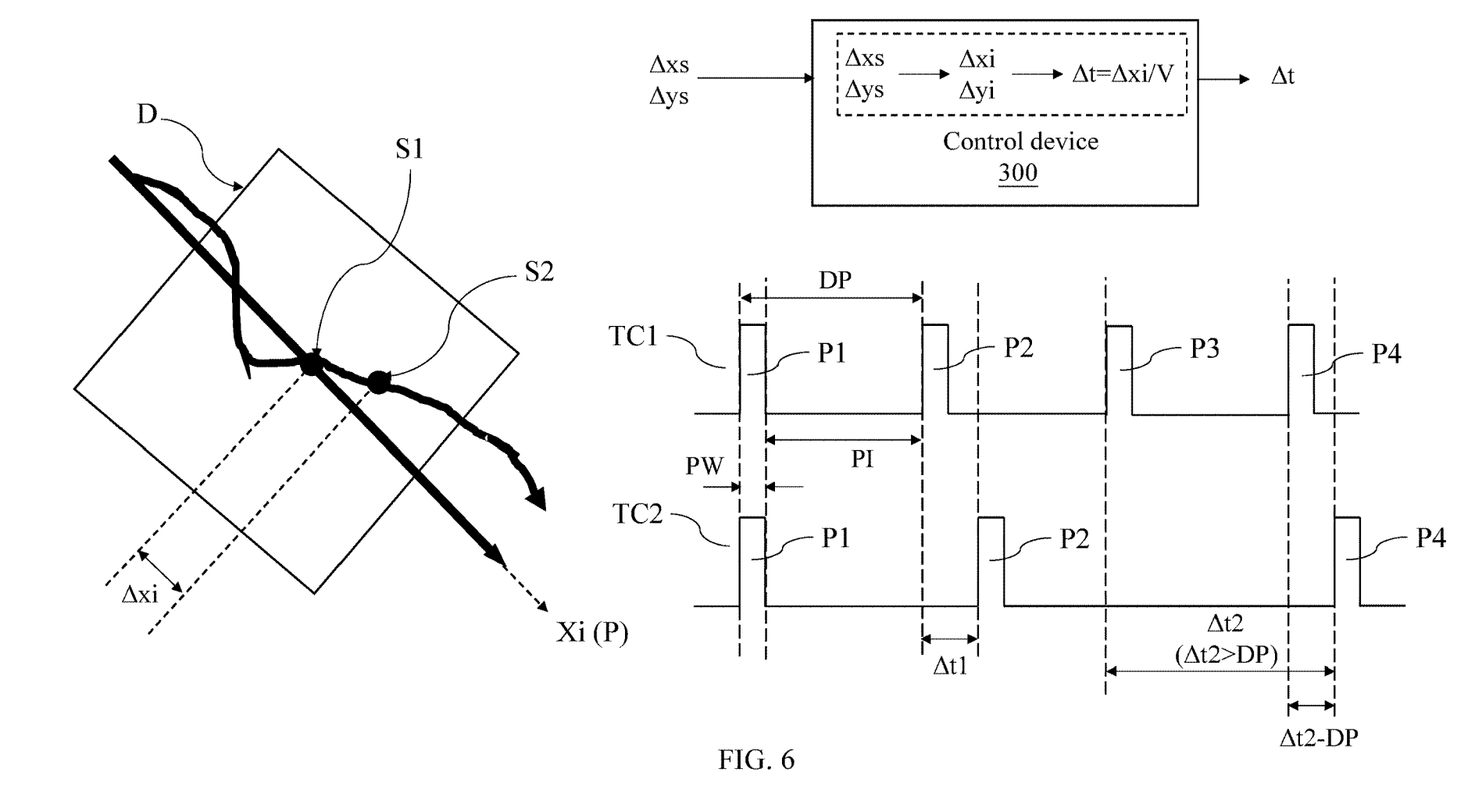
FIG. 6 is a schematic diagram of operations for mitigating a component of undesired effects caused by the disturbance according to some embodiments of the present disclosure.
Figure 8:
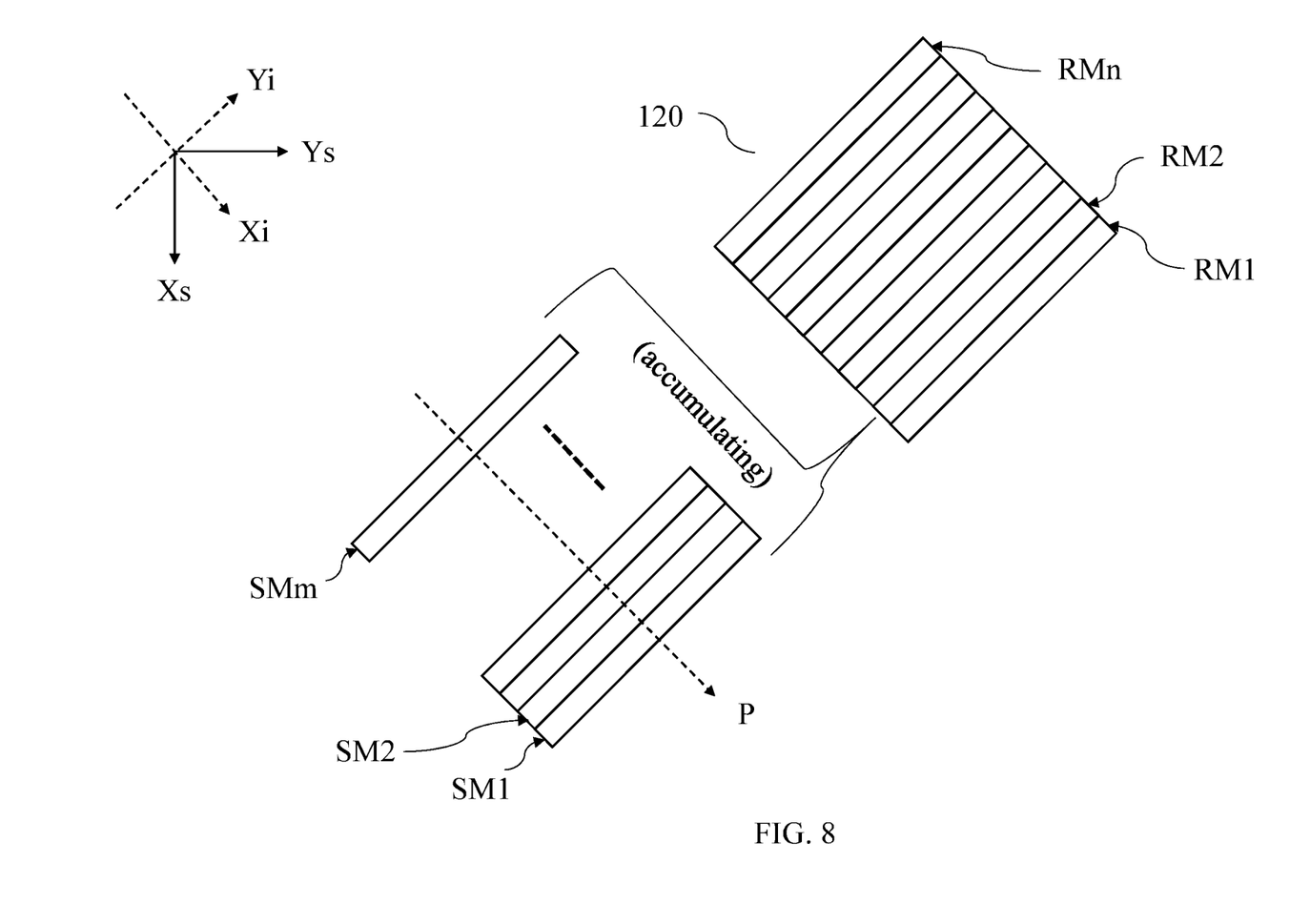
FIG. 8 and FIG. 9 are schematic diagrams of operations for mitigating another component of the undesired effects caused by the disturbance according to some embodiments of the present disclosure.
Figure 9:
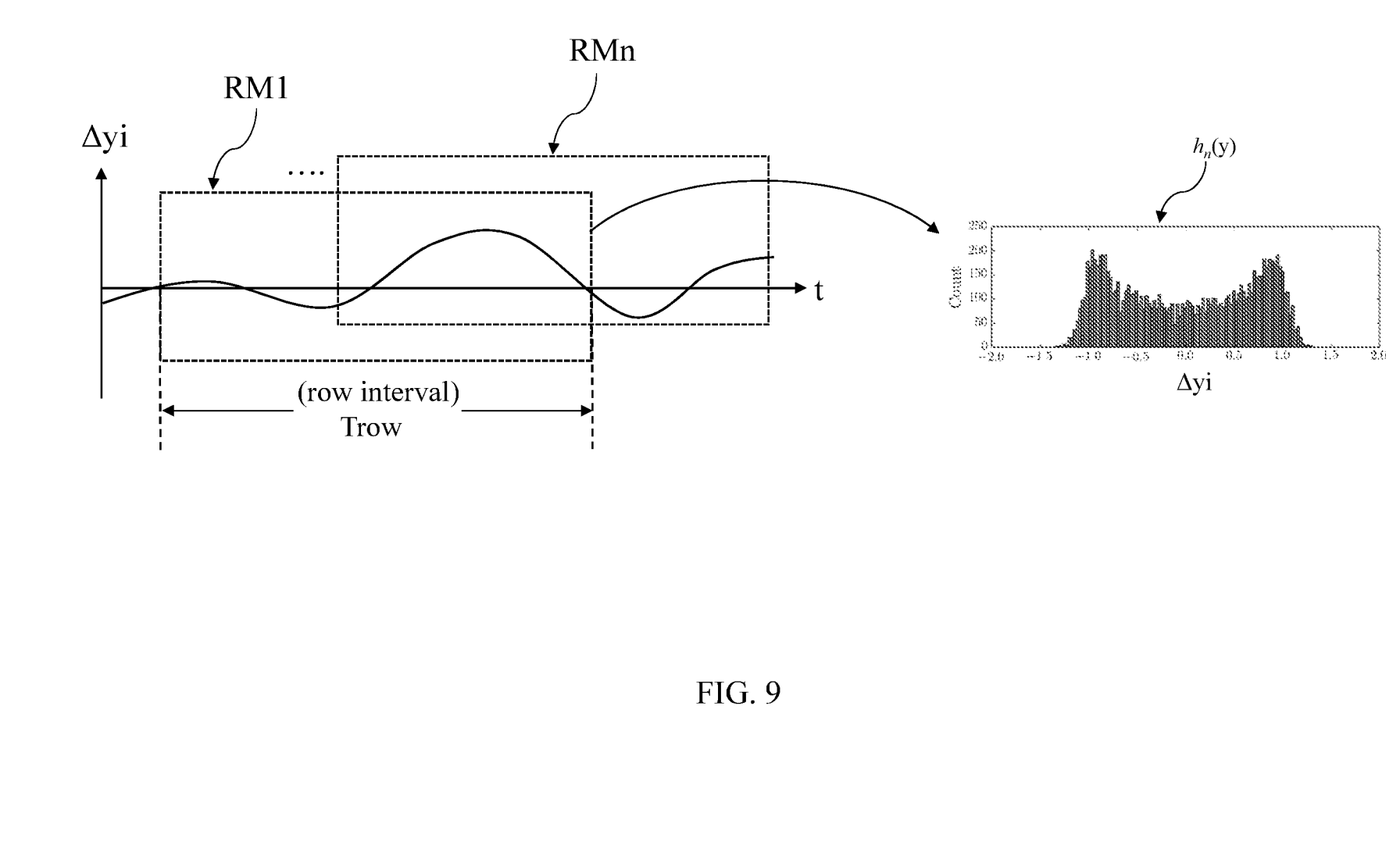

In some embodiments, the undesired effects cause by the horizontal displacement Δxi and the vertical displacement Δyi can be mitigated independently. FIG. 6 shows the operations for mitigating the undesired effects caused by the horizontal displacement Δxi, and FIG. 8 and FIG. 9 show the operations for mitigating the undesired effects caused by the vertical displacement Δyi.

During the operations, the image sensor 120 ideally captures the reflected light L2 reflected from the position S1 without disturbance. However, when the horizontal displacement Δxi exists, the image sensor 120 actually captures the reflected light L2 reflected from the position S2 rather than the position S1. In order to mitigate the effect caused by the horizontal displacement Δxi, the control device 300 is configured to calculate a time offset Δt according to the horizontal displacement Δxi and the moving speed V of the movable stage, and configured to control the timing for the image sensor 120 to capture the reflected light L2 reflected from the position S1 according to the time offset Δt. Specifically, the control device 300 calculates the time offset Δt using an expression of Δt=Δx/V. In some embodiments, the moving speed V is a constant.

As mentioned above, the field of view of the image sensor 120 will move along the predetermined moving path P or the actual moving path P' in the opposite direction of the arrow. A region in including the position S1 is supposed to be projected by the field of view of the image sensor 120 in the ideal case at a specific time node, however, due to the disturbance, a region including the position S2 instead of the position S1 is projected by the field of view of the image sensor 120 at the specific time node. The disturbance causes the region including S1 on the predetermined moving path P is offset to the region including S2 on the actual moving path P'. As illustrated in FIG. 6, along the opposite direction of the arrow of actual moving path P', the position S2 appears earlier than the position S1 to the field of view of the image sensor 120, which indicates that the timing of the image sensor 120 capturing the reflected light L2 has to be delay for the time offset Δt until the positions S1 enters the region projected by the field of view of the image sensor 120, so that the image sensor 120 can capture the reflected light L2 reflected from the position S1. Similarly, along the opposite direction of the arrow of actual moving path P', when the position S2 appears later than the position S1 to the image sensor 120, it indicates that the timing of the image sensor 120 capturing the reflected light L2 has to be advanced to an earlier time node that the position S1 was in the region projected by the field of view of the image sensor 120, so that the image sensor 120 can capture the reflected light L2 reflected from the position S1. When the position S2 appears earlier than the position S1, the time offset Δt is defined to be positive; and when the position S2 appears later than the position S1, the time offset Δt is defined to be negative.

If the incident light L1 is a CW laser, the control device 300 delays a trigger time of the shutter of the image sensor 120 when the time offset Δt is positive, and advances the trigger time of the shutter when the time offset Δt is negative.

If the incident light L1 is the pulsed laser, the control device 300 adjusts a pulse period of the incident light L1 according to the time offset Δt so as to adjust the time the image sensor 120 captures image. More specifically, the control device 300 is configured to adjust a timing for the light source 110 to emit the incident light L1. In some embodiments, the timing for emitting the incident light L1 can only be delayed. However, the actual position S2 may appear later than the ideal position S1, i.e., the time offset Δt could be negative. Therefore, the control device 300 may offset the time offset Δt before instructing the light source 110. In some embodiments, a lower limit and an upper limit of horizontal displacement Δxi are associated with the wafer inspection system 10, and can be obtained offline. The upper limit and lower limit correspond to a positive maximum time offset and a negative maximum time offset, respectively. For example, the positive maximum time offset and the negative maximum time offset are +100 μs (micro-second) and −100 μs. Under this situation, the control device 300 offsets the time offset Δt by adding 100 μs. In other words, the control device 300 shifts the range of the time offset Δt from +100 μs to 0-200 μs. Thereafter, the time offset Δt is always positive. When the control device 300 offsets the time offset Δt, the motion of the movable stage 210 should be offset with the same amount accordingly.

In other embodiments, when a displacement exceeds a range between the upper limit and the lower limit, the control device 300 sets the time offset Δt to the maximum or the minimum value, such as 200 μs or 0 μs in the above example.

As shown in FIG. 6, a time series chart TC1 illustrates a plurality of laser pulses emitted by the light source 110 without horizontal displacement Δxi. Each of the laser pulses has a pulse period DP including a pulse width PW and a pulse interval PI, in which the pulse width PW represents a duration of the laser being emitted, and the pulse interval PI represents a duration of the laser being not emitted between two adjacent pulse widths. The pulse period DP is equal to the pulse width PW adding the pulse interval PI.

A time series chart TC2 illustrates the laser pulses with horizontal displacement Δxi. When the horizontal displacement Δxi is introduced, the time series chart TC1 is updated, according to the time offset Δt, to form the time series chart TC2. To facilitate understanding, the laser pulses are designated by P1 to P4.

Without the horizontal displacement Δxi, a first, second, third, and fourth laser pulses P1, P2, P3, and P4 have identical pulse period DP in the time series chart TC1. When the horizontal displacement Δxi is introduced, the control device 300 calculates the time offset Δt with respect to the horizontal displacement Δxi, and transmits the time offset Δt as a control signal to the light source 110. It should be noted that the first dynamic position error Δxs and the horizontal displacement Δxi vary with time, therefore, the time offset Δt varies with time as well. The control device 300 instructs the light source 110 to adjust the pulse period DP of each laser pulse according to the time offset Δt. In FIG. 6, a time offset Δt1 with respect to the second laser pulse P2 is introduced into the pulse interval PI prior to the second laser pulse P2. The pulse interval PI between the first laser pulse P1 and the second laser pulse P2 is extended by the time offset Δt1, so as to delay the timing for emitting the second laser pulse P2. It should be noted that delaying the pulse period DP merely changes the pulse interval PI, but the pulse width PW is not changed.

In some embodiments, when the time offset Δt is greater than the original pulse period DP, the control device 300 is configured to instruct the light source 110 to mask the laser pulse. For example, a time offset Δt2 with respect to the third laser pulse P3 is obtained, and the third laser pulse P3 is supposed to be delayed according to the time offset Δt2. However, the time offset Δt2 is greater than the original pulse period DP, if the third pulse P3 is delayed and emitted according to the time offset Δt2, the delayed third laser pulse P3 would overlap the fourth laser pulse P4. Thus, the control device 300 instructs the light source 110 to mask the third laser pulse P3 and use the fourth laser pulse P4 instead.

Figure 7:
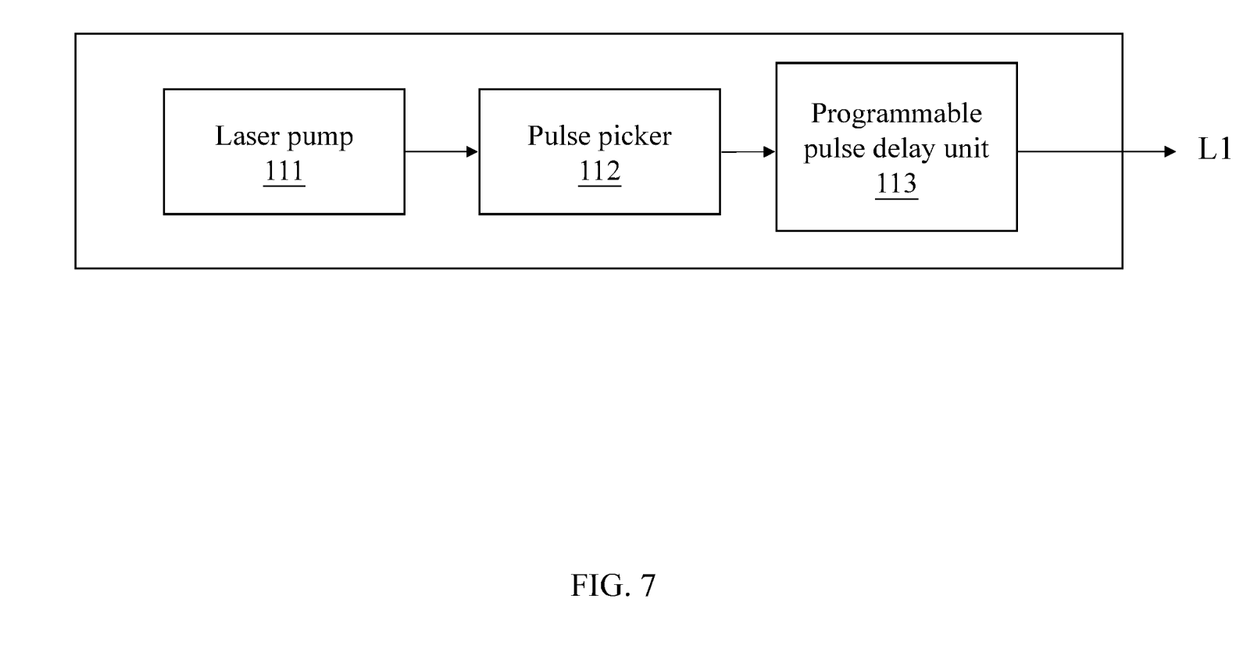
FIG. 7 is a schematic diagram of a light source of an optical device of the wafer inspection system according to some embodiments of the present disclosure.

Reference is made to FIG. 7. FIG. 7 is a schematic diagram of the light source 110 according to embodiments of the present disclosure. In some embodiments, the light source 110 includes a laser pump 111, a pulse picker 112, and a programmable pulse delay unit 113. The laser pump 111 is configured to generate laser pulses with constant pulse period DP into the pulse picker 112. In some embodiments, the pulse picker 112 is an optical cavity configured to receive the laser pulses generated by the laser pump 111. The pulse picker 112 is further configured to control whether to mask at least one of the laser pulses according to the control signal, i.e., the time offset Δt transmitted by the control device 300. The programmable pulse delay unit 113 is configured to adjust the pulse period DP in response to the control signal.

In various embodiments, the laser pump 111 may acceptable for various timing period control pulses, and the control device 300 does not calculate the time offset Δt. In such embodiments, the position measurement device 220 transmits the position of the wafer W to the control device 300. When the position of the wafer W reaches predetermined locations, the control device 300 instructs the laser pumper 111 to emit the incident light L1, and the pulse picker 112 and the programmable pulse delay unit 113 are not necessary. For example, the predetermined locations are locations evenly arranged on the predetermined moving path P. When the position of the wafer W and each of the predetermined locations have no displacement therebetween along the first image axis Xi, the control device 300 determines that the position of the wafer W reaches one of the predetermined locations. It should be noted that, in this embodiment, the time intervals between each emission are not constant due to the horizontal displacement Δxi, and the control device 300 determines that whether the position of the wafer W reaches the predetermined locations without taking the vertical displacement Δyi into consideration.

In some embodiments, the image sensor 120 is a time-delayed and integration (TDI) sensor. In FIG. 8, a sensing area of the image sensor 120 is composed by N row pixels, and each row pixel is configured to generate a row image, in which N is a positive integer. The operation of generating a row image includes M stages, and the image sensor 120 generates a stage image in each stage, in which M is a positive integer greater than 1. The image sensor 120 is configured to accumulate data of M stage images to generate the corresponded row image. In some embodiments, each row pixel includes a plurality of pixels, and the image sensor 120 is disposed to make the pixels extending along a direction perpendicular to the predetermined moving path P. In some embodiments, the control device 300 is further configured to rotate the image sensor 120 to make the arrangement of the pixels perpendicular to the predetermined moving path P.

As shown in FIG. 8, a first row image RM1, a second image RM2 to an $N_{th}$ row images RMn and a first stage image SM1, a second image SM2 to an $M_{th}$ stage image SMm are illustrated. Each row image is accumulated by a first stage image S1 to the $M_{th}$ stage image SMm.

The image sensor 120 spends a row interval Trow to generate a row image, i.e., each row image is captured during a row interval Trow. The row interval Trow is equal to M×T, in which T is equal to a duration of a stage. In some embodiments, the moving speed V of the movable stage 210 is equal to a width of a pixel in the row pixel over T. In some embodiments, the image processing device 500 is configured to record the vertical displacement Δyi during each row interval Trow as illustrated in FIG. 9. Further, the image processing device 500 is configured to perform a statistical analysis to generate a histogram according to the vertical displacements Δyi of M stage images of each row image. For example, in FIG. 9, the image processing device 500 performs a statistical analysis upon the vertical displacements Δyi of M stage images of the $N_{th}$ row image RMn to obtain the histogram $h_n(y)$.

In some embodiments, a row image without the vertical displacement Δyi and the row image with the vertical displacement Δyi have a relationship expressed by equation (1).

$$RMa = \int RMa'(\Delta y) \cdot h_n (y - \Delta y) d\Delta y \qquad (1)$$

RMa is the $a_{th}$ row image with the vertical displacement Δyi, and RMa' is the $a_{th}$ row image without the vertical displacement Δyi.

The image processing device 500 further performs a de-convolution upon the row image and the corresponded histogram within the corresponded row interval Trow, so as to generate a calibrated row image. In the calibrated row image, the effect caused by the vertical displacement Δyi can be removed or greatly mitigated. In some embodiments, the de-convolution can be expressed by equation (2).

$$RMa'(y) = \mathcal{F}^{-1}\{\mathcal{F}\{RMa\}/H_n\} \qquad (2)$$

$H_n$ is the Fourier transform of the histogram $h_n(y)$.

After the calibrated row image RM1' to RMn' are obtained, the image processing device 500 generates the updated image M' according to the calibrated row images.

An aspect of the present disclosure provides the wafer inspection system, which is able to control, in real-time, the lighting source and/or camera's timing for capturing the image of the wafer according to the horizontal displacement. Another aspect of the present disclosure provides the wafer inspection system, which is able to calibrate the image of wafer according to the vertical displacement. The noise induced by the horizontal displacement and/or the vertical displacement can be reduced using the inspection system of the present disclosure, and the image of the wafer having less noise is beneficial to inspection.

The foregoing outlines features of several embodiments of the present application so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A wafer inspection system, comprising:
  an optical device, comprising:
    a light source, configured to generate an incident light and direct the incident light through an illumination optical toward a wafer, so as to generate a reflected light accordingly; and
    an image sensor, configured to capture the reflected light through an imaging optical and generate an image of the wafer accordingly;
  a movable stage, configured to bear the wafer and move the wafer according to a predetermined moving path;
  a position measurement device, configured to obtain a position offset between an actual moving path of the movable stage and the predetermined moving path, wherein the position offset comprises a first dynamic position error and a second dynamic position error in a stage coordinate system, wherein the first dynamic position error and the second dynamic position error both vary with time, the stage coordinate system has a first stage axis and a second stage axis perpendicular to each other, and the first dynamic position error and the second dynamic position error are parallel to the first stage axis and the second stage axis, respectively; and a control device, configured to control a timing for the light source to emit the incident light or control the image sensor to capture the reflected light according to the first dynamic position error and the second dynamic position error in real time in order to mitigate undesired effects caused by the position offset.

2. The wafer inspection system of claim 1, wherein the image is defined by an image coordinate system including a first image axis and a second image axis perpendicular to each other, and the first image axis is parallel to the predetermined moving path, wherein an included angle between the first stage axis and the first image axis is greater than 0 degree and less than 90 degrees, wherein when the movable stage moves the wafer, the wafer stays at the actual moving path.

3. The wafer inspection system of claim 2, wherein the included angle is substantially 45 degrees.

4. The wafer inspection system of claim 2, wherein the control device is configured to convert the first dynamic position error and the second dynamic position error of the stage coordinate system into a horizontal displacement of the image coordinate system, wherein the horizontal displacement is parallel to the first image axis, and the control device is configured to mitigate a first portion of the undesired effects.

5. The wafer inspection system of claim 4, wherein the control device is further configured to calculate a time offset corresponding to the horizontal displacement according to a moving speed of the movable stage.

6. The wafer inspection system of claim 5, wherein the incident light is in a form of pulsed laser beam, and the control device generates a control signal to instruct the light source to adjust a pulse period of a first laser pulse of a plurality of laser pulses according to the time offset with respect to the first laser pulse.

7. The wafer inspection system of claim 6, wherein the control device generates the control signal to instruct the light source further to adjust a pulse period of a second laser pulse of the plurality of laser pulses according to the time offset with respect to the second laser pulse, wherein the pulse period of the first laser pulse and the pulse period of the second laser pulse are different.

8. The wafer inspection system of claim 6, wherein the light source comprises:

a laser pump, configured to generate the plurality of laser pulses with a constant pulse period;

a pulse picker, configured to control whether to mask at least one of the laser pulses according to the control signal; and a programmable pulse delay unit, configured to adjust the pulse period of the laser pulses in response to the control signal.

9. The wafer inspection system of claim 8, wherein when the time offset with respect to the first laser pulse is greater than the pulse period of the first laser pulse, the first laser pulse is masked by the pulse picker and use a second laser pulse to generate a delayed pulse.

10. The wafer inspection system of claim 6, wherein the time offset is positive only, and the light source increases a length of the pulse period of the first laser pulse by the time offset with respect to the first laser pulse.

11. The wafer inspection system of claim 5, wherein the incident light is in a form of a continuous wave laser beam, the control device adjust a trigger time of a shutter of the image sensor according to the time offset.

12. The wafer inspection system of claim 2, wherein the control device is configured to convert the first dynamic position error and the second dynamic position error of the stage coordinate system into a vertical displacement of the image coordinate system, wherein the vertical displacement is parallel to the second image axis.

13. The wafer inspection system of claim 12, wherein the image sensor is a time-delayed and integration (TDI) sensor configured to generate the image including N row images, wherein each of the row images is accumulated by M stage images corresponding to M stages.

14. The wafer inspection system of claim 13, further comprising:

an image processing device, configured to mitigate a second portion of the undesired effects caused by the vertical displacement.

15. The wafer inspection system of claim 14, wherein the M stage images of each of the row images are captured during a row interval, wherein the row interval is equal to M*T, wherein T is equal to a duration for each of the stages, wherein the image processing device is configured to make a statistic to generate a histogram according to the vertical displacement of each stage image of at least one row image, and perform a de-convolution of the at least one row image and the histogram within the corresponded row interval, so as to generate a calibrated row image.

16. The wafer inspection system of claim 13, wherein the image sensor comprises a plurality of pixels for capturing the stage images, wherein an arrangement of the plurality of pixels is extended along a direction perpendicular to the predetermined moving path.

17. The wafer inspection system of claim 16, wherein the moving speed of the movable stage is equal to a width of each of the pixels over T.

18. The wafer inspection system of claim 16, wherein the control device is further configured to rotate the image sensor to make the arrangement of the plurality of pixels perpendicular to the predetermined moving path.

19. The wafer inspection system of claim 18, wherein the control device rotates the image sensor according to an offline data associated with a vibration of the wafer inspection system, wherein after the image sensor is rotated, a horizontal displacement is greater than the vertical displacement.

20. The wafer inspection system of claim 1, further comprising:

a load lock device, configured to load the wafer to the movable stage, wherein the wafer includes a plurality of die areas arranged along a plurality of columns, wherein the load lock device is further configured to rotate the wafer to make the columns to extend along a direction parallel to the predetermined moving path.

* * * * *